(12) United States Patent
Miyake et al.

(10) Patent No.: US 11,658,457 B2
(45) Date of Patent: May 23, 2023

(54) MOUNTING STRUCTURE FOR OPTICAL MODULE

(71) Applicant: Panasonic Intellectual Property Management Co., Ltd., Osaka (JP)

(72) Inventors: Takahiro Miyake, Osaka (JP); Yasuhisa Inada, Osaka (JP); Tosihiko Wada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 477 days.

(21) Appl. No.: 16/780,856

(22) Filed: Feb. 3, 2020

(65) Prior Publication Data

US 2020/0266604 A1 Aug. 20, 2020

(30) Foreign Application Priority Data

Feb. 15, 2019 (JP) .............................. JP2019-026018

(51) Int. Cl.
| | |
|---|---|
| *H01S 5/022* | (2021.01) |
| *G02B 6/42* | (2006.01) |
| *H01S 5/023* | (2021.01) |
| *G02B 6/34* | (2006.01) |
| *G02B 6/02* | (2006.01) |
| *G02B 5/18* | (2006.01) |

(52) U.S. Cl.
CPC .............. *H01S 5/022* (2013.01); *G02B 5/18* (2013.01); *G02B 6/02209* (2013.01); *G02B 6/34* (2013.01); *G02B 6/42* (2013.01); *G02B 6/4204* (2013.01); *G02B 6/4214* (2013.01); *H01S 5/023* (2021.01)

(58) Field of Classification Search
None
See application file for complete search history.

(56) References Cited

U.S. PATENT DOCUMENTS

| | | | |
|---|---|---|---|
| 5,247,506 | A | 9/1993 | Sugiura |
| 7,199,926 | B2 | 4/2007 | Ohmori et al. |
| 7,385,761 | B2 | 6/2008 | Ohmori et al. |
| 7,633,680 | B2 | 12/2009 | Ohmori |
| 8,285,151 | B2 | 10/2012 | Shen et al. |

(Continued)

FOREIGN PATENT DOCUMENTS

| | | |
|---|---|---|
| CN | 1318760 | 10/2001 |
| CN | 106461864 | 2/2017 |

(Continued)

OTHER PUBLICATIONS

English Translation of Chinese Search Report dated Jun. 23, 2022 in corresponding Chinese Patent Application No. 202010085637.0.

*Primary Examiner* — Omar R Rojas
(74) *Attorney, Agent, or Firm* — Wenderoth, Lind & Ponack, L.L.P.

(57) ABSTRACT

A mounting structure for an optical module includes a light emitting element, a submount board on which the light emitting element is mounted, a main board on which the submount board is mounted, a light guide member provided on the main board, and a diffraction grating optical coupler provided on the main board and connected to the light guide member. The submount board and the main board are bonded to each other on a surface of the submount board different from a surface on which the light emitting element is mounted.

10 Claims, 4 Drawing Sheets

(56) References Cited

U.S. PATENT DOCUMENTS

| | | | |
|---|---|---|---|
| 9,373,934 B2* | 6/2016 | Lin | ............................ H01S 5/141 |
| 10,151,877 B2 | 12/2018 | Hayakawa | |
| 10,381,799 B2* | 8/2019 | Suzuki | .................. H01S 5/0267 |
| 2001/0024552 A1 | 9/2001 | Kitaoka et al. | |
| 2013/0188904 A1 | 7/2013 | Min et al. | |
| 2015/0205062 A1 | 7/2015 | Collins et al. | |
| 2015/0295384 A1 | 10/2015 | Tatah | |
| 2015/0309261 A1 | 10/2015 | Kobyakov et al. | |

FOREIGN PATENT DOCUMENTS

| | | |
|---|---|---|
| JP | 9-102650 | 4/1997 |
| JP | 2000-215503 | 8/2000 |
| JP | 2003-279804 | 10/2003 |
| JP | 2006-154096 | 6/2006 |
| JP | 2009-525494 | 7/2009 |
| JP | 2012-208371 | 10/2012 |
| JP | 2013-149980 | 8/2013 |
| JP | 2015-524579 | 8/2015 |
| JP | 2017-219562 | 12/2017 |
| JP | 2018-084778 | 5/2018 |

* cited by examiner

MOUNTING STRUCTURE FOR OPTICAL MODULE

TECHNICAL FIELD

The technical field relates to amounting structure for entering laser light from a light emitting element into a minute waveguide in an optical module.

BACKGROUND

In recent years, utilization of light has been studied in the fields of high-speed and large-capacity communication and optical sensing. In the fields of large-capacity communication and optical sensing, it is necessary to allow laser light from a light emitting element such as a semiconductor laser to enter a light guide member such as an optical fiber in a device. Then, miniaturization of the light guide member is progressing due to the necessity of integration. Therefore, high position accuracy of the semiconductor laser with respect to the light guide member has been demanded.

Japanese Patent Unexamined Publication No. 2018-84778 discloses a technique using a diffraction grating optical coupler in order to allow laser light of a semiconductor laser (hereinafter, referred to as "laser light" unless otherwise specified) to enter an optical fiber.

Japanese Patent Unexamined Publication No. 2018-84778 describes a technique that can reduce the position accuracy required for a semiconductor laser as compared with a case where a diffraction grating optical coupler is used and laser light is directly incident on an optical fiber.

However, in a case where the miniaturization of the optical fiber progresses and the position accuracy of the optical fiber is required on a micrometer order, there is the following problem when laser light is incident on the optical fiber.

In a method in which laser light is directly incident on an optical fiber, the optical fiber is mounted on a board with fine position accuracy on a micrometer order. For an optical waveguide that requires micrometer-order position accuracy, a semiconductor laser that enters laser light into the optical waveguide is required to have position accuracy on several tens to several hundreds of nanometer order with respect to the board. Therefore, it is difficult to mount a semiconductor laser for technical reasons.

In the method of Japanese Patent Unexamined Publication No. 2018-84778 in which laser light is incident on an optical fiber mounted with high position accuracy via a diffraction grating optical coupler, the edge emitting laser light has a large spread angle and spreads about 30° in the vertical direction. In a case of using a reflection mirror, the distance from an emission port of the laser light to the diffraction grating optical coupler is long, and a light incident range is widened. Therefore, in order to receive the spread laser light, an enlarged diffraction grating optical coupler is necessary. The enlarged diffraction grating optical coupler has a problem that optical efficiency is lowered because the incident laser light is re-emitted after the laser light is incident.

SUMMARY OF THE INVENTION

To solve the above problem, there is provided a mounting structure for an optical module. The mounting structure includes a light emitting element, a submount board on which the light emitting element is mounted, a main board on which the submount board is mounted, a light guide member provided on the main board, and a diffraction grating optical coupler provided on the main board and connected to the light guide member. The submount board and the main board are bonded to each other on a surface of the submount board different from a surface on which the light emitting element is mounted.

According to the present disclosure, it is possible to provide an optical module structure that enters laser light from a light emitting element into a fine waveguide having high position accuracy in an optical module.

DESCRIPTION OF EMBODIMENTS

Hereinafter, embodiments of the present disclosure will be described with reference to the drawings.

First Embodiment

Figure 1:
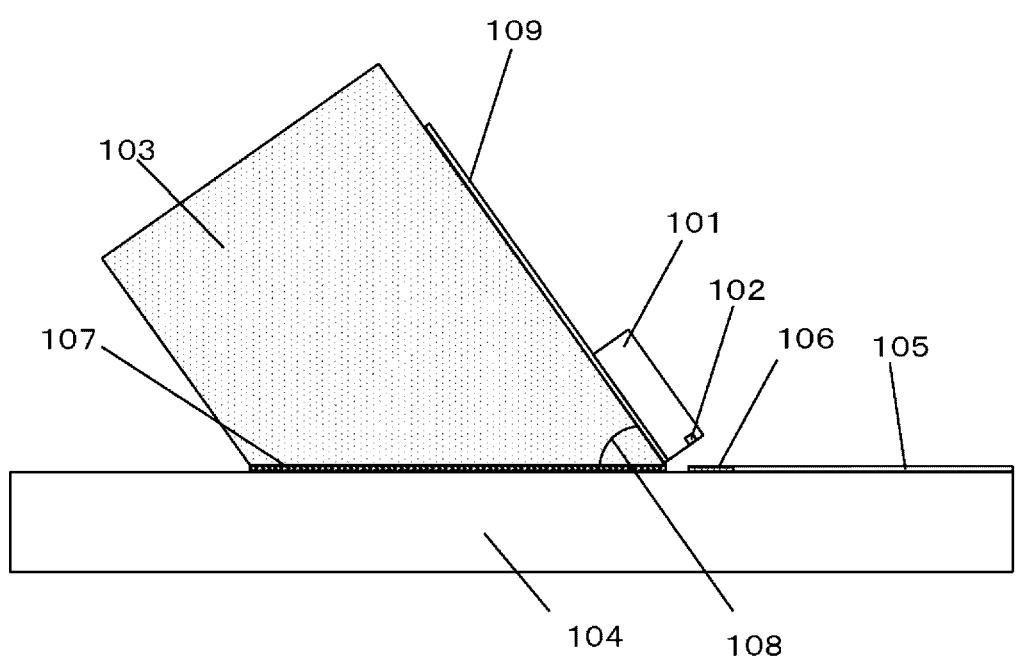
FIG. 1 is a sectional view showing a mounting structure according to a first embodiment.

FIG. 1 is a schematic sectional view showing a mounting structure according to a first embodiment of the present disclosure. Edge emitting semiconductor laser 101 which is a light emitting element has emission port 102. Semiconductor laser 101 is mounted on a first surface of submount board 103. Submount board 103 has electrode 109 on the first surface for bonding semiconductor laser 101. Semiconductor laser 101 and submount board 103 are bonded to each other via a bonding member. Examples of the bonding member include gold tin, solder, and gold stud bump. Main board 104 is provided with light guide member 105 for receiving laser light from semiconductor laser 101.

Light guide member 105 has diffraction grating optical coupler 106 for coupling laser light. Diffraction grating optical coupler 106 couples the laser light according to an incident angle of the laser light. Main board 104 and submount board 103 are bonded to each other on an inclined side (second) surface of submount board 103 via adhesive material 107 so that laser light can be incident on diffraction grating optical coupler 106 at a predetermined angle. Adhesive material 107 is, for example, a UV curable resin. As shown in FIG. 1, the second surface of the submount board 103 is different from (not the same surface as) the first surface on which the light emitting element 101 is mounted.

Angle 108 between main board 104 and submount board 103 may be any degree of angle because diffraction grating optical coupler 106 can be designed according to the angle. However, in order to form the mounting structure with high accuracy, it is preferable to use anisotropic etching in which submount board 103 is formed of a single crystal of silicon and can be processed according to the crystal orientation of silicon. When silicon is formed by anisotropic etching, the angle of the edge of submount board 103, that is, angle 108 is 54.74°. Here, this angle has a variation of ±5° or less depending on, for example, whether or not a wafer is sliced from a silicon ingot with high accuracy.

Angle 108 is an angle formed between a surface of main board 104 on which diffraction grating optical coupler 106 is mounted and a surface of submount board 103 on which semiconductor laser 101 is mounted. Angle 108 is the angle formed between the surfaces, and the angle formed between normal vectors perpendicular to each surface.

Figure 2:
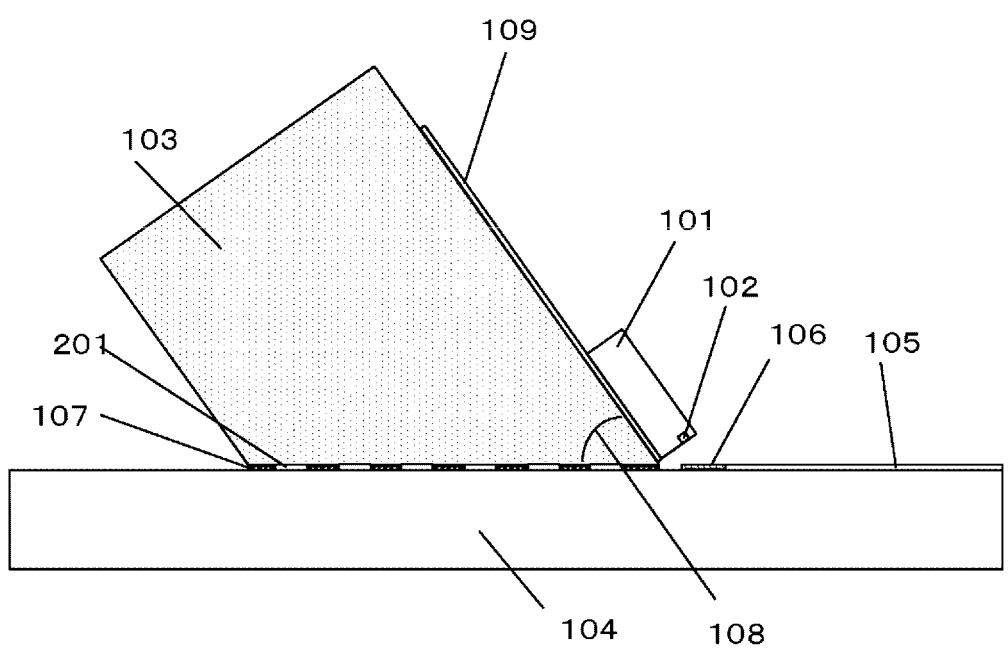
FIG. 2 is a sectional view showing the mounting structure according to the first embodiment.

When submount board 103 is mounted on main board 104, the position at which the laser is incident on diffraction grating optical coupler 106 is affected. Therefore, the mounting accuracy of submount board 103 in the vertical direction of main board 104 needs to be high. When only adhesive material 107 is present between main board 104 and submount board 103, adhesive material 107 is generally a non-rigid material. Accordingly, a gap (interval) between main board 104 and submount board 103 cannot be set to a predetermined value. Therefore, as shown in FIG. 2, it is better to form spacer 201 on main board 104 and to position main board 104 and submount board 103 in the vertical direction via spacer 201. Thereafter, it is preferable to bond and mount main board 104 and submount board 103 with adhesive material 107.

Spacer 201 is formed by a semiconductor process performed when main board 104 is formed, so that spacer 201 can be adjusted in thickness with high accuracy. Therefore, the gap formed between main board 104 and submount board 103 can be set to a predetermined value. Spacer 201 is formed of, for example, metal or resin. When the spacer is formed of an elastic resin, a small gap due to dust or unevenness can be absorbed. In order to allow the laser light to enter diffraction grating optical coupler 106 without spreading as much as possible, it is preferable that a distance between semiconductor laser 101 and diffraction grating optical coupler 106 is close. Therefore, it is preferable that the position where semiconductor laser 101 is mounted on submount board 103 is close to a tip portion processed by anisotropic etching.

Figure 3:
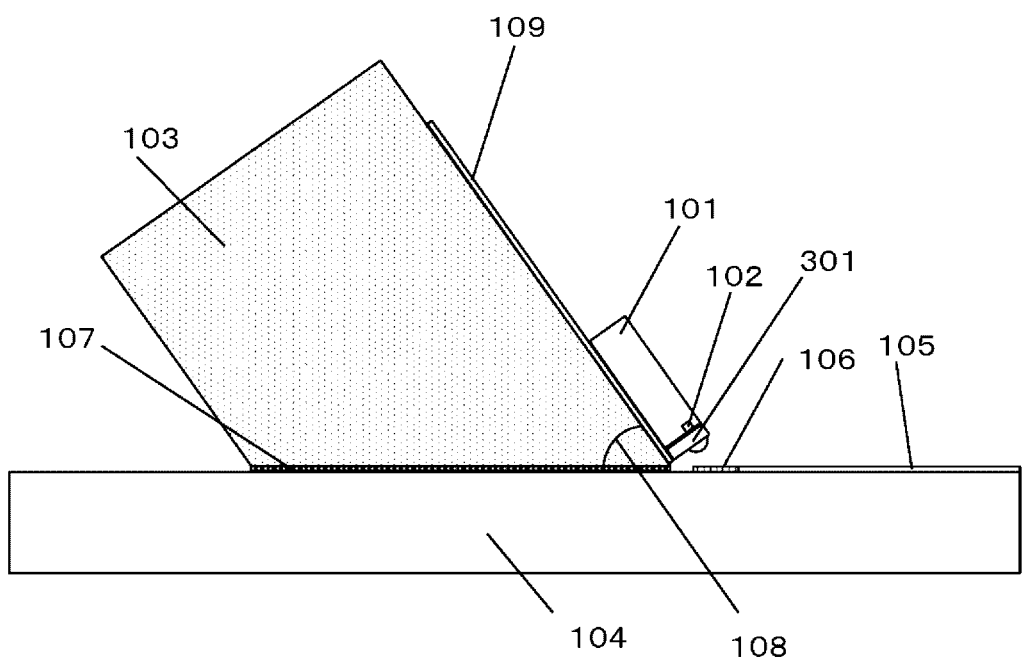
FIG. 3 is a sectional view showing the mounting structure according to the first embodiment.

When it is desired to stop the laser light and make it incident on diffraction grating optical coupler 106, as shown in FIG. 3, lens 301 may be provided between semiconductor laser 101 and diffraction grating optical coupler 106, and the laser light may be stopped by lens 301.

Spacer 201 and lens 301 described above may be used in combination.

Second Embodiment

Also in the above-described embodiment, the laser light can be incident on diffraction grating optical coupler 106 at a predetermined angle, and the distance between semiconductor laser 101 and diffraction grating optical coupler 106 can be reduced. For further miniaturization of light guide member 105, a second embodiment is preferable. Matters not described are the same as those in the above-described embodiment.

Even in the case where semiconductor laser 101 is mounted on the tip of submount board 103 as in the embodiment described above, depending on the thickness of semiconductor laser 101 and the thickness of submount board 103, the distance between emission port 102 of semiconductor laser 101 and diffraction grating optical coupler 106 is increased, and the laser light spreads. Even when a lens is provided between semiconductor laser 101 and diffraction grating optical coupler 106, the position where the lens is installed is required to have high accuracy. Accordingly, the lens cannot be mounted.

Figure 4:
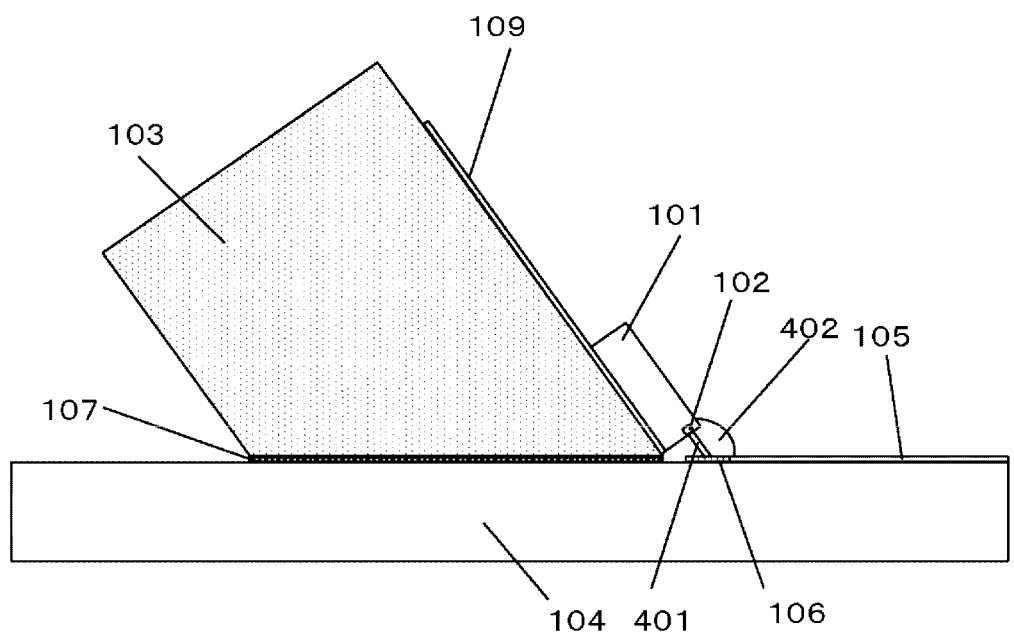
FIG. 4 is a sectional view showing a mounting structure according to a second embodiment.

The second embodiment will be described with reference to FIG. 4. FIG. 4 is a schematic sectional view showing a mounting structure according to the second embodiment of the present disclosure. The configuration between semiconductor laser 101 and diffraction grating optical coupler 106 is different from the above-described embodiment.

In the second embodiment, core 401 is provided between semiconductor laser 101 and diffraction grating optical coupler 106 as a high refractive member having a high refractive index with respect to laser light and clad 402 is provided as a low refractive member having a lower refractive index than core 401 with respect to laser light. Semiconductor laser 101 as the light emitting element and diffraction grating optical coupler 106 are connected by core 401 as the high refractive member and clad 402 as the low refractive member. Core 401 and clad 402 are self-forming optical waveguides formed of a self-forming optical waveguide material. The self-forming optical waveguide is formed from a self-forming optical waveguide material containing two photocurable resins. The self-forming optical waveguide is, for example, a light guide member such as an optical fiber. One of the two photocurable resins is cured at the wavelength of laser light of the semiconductor laser. The other photocurable resin is cured at a wavelength different from the wavelength of the previous laser light.

The photocurable resin cured at the wavelength of the laser light of semiconductor laser 101 has a higher refractive index of the laser light than the photocurable resin cured at the wavelength different from the wavelength of the laser light of semiconductor laser 101.

The curing with the two photocurable resins is preferably a photocurable resin having a different polymerization method such as radical polymerization and cationic polymerization. As an example of these materials, Aronix M-1100 (manufactured by Toagosei Co., Ltd.) is used as a photocurable resin having a high refractive index with respect to laser light, and OXT-101 (manufactured by Toagosei Co., Ltd.) is used as a photocurable resin having a low refractive index with respect to laser light.

The portion between semiconductor laser 101 and diffraction grating optical coupler 106 is filled with the self-forming optical waveguide material. By irradiating the portion filled with the self-forming optical waveguide material with laser light, the high refractive index component of the photocurable resin is cured, and core 401 is formed. By simultaneously emitting the laser light and laser light from another semiconductor laser (not shown) from light guide member 105 side, the laser light in the portion where the respective laser lights overlap becomes strong. Core 401 is formed around the portion where the laser lights overlap. Therefore, even in a case where the coupling position between the laser of semiconductor laser 101 and diffraction grating optical coupler 106 is shifted, when there is a portion where each laser overlaps, core 401 is formed following the overlapping portion. The above-described other semiconductor laser may not be mounted on main board 104 or submount board 103. The above-described semiconductor laser may be disposed outside main board 104 or submount board 103, and for example, the fiber of a fiber laser may be brought close to the outside of emission port 102 to irradiate the self-forming optical waveguide material with laser light. The above-described other semiconductor laser may be mounted on either main board 104 or submount board 103.

The other photocurable resin that cures at a wavelength different from the wavelength of the laser of semiconductor laser 101 is cured to form clad 402. Core 401 has a higher refractive index of laser light than clad 402. By forming such a self-forming optical waveguide having core 401 and clad 402, the laser light of semiconductor laser 101 can be incident on diffraction grating optical coupler 106 without being diffused.

Third Embodiment

A third embodiment differs from the first embodiment and the second embodiment (FIGS. 1 to 3) in the angle of the laser light incident on diffraction grating optical coupler 106. Matters not described are the same as those in the first embodiment and the second embodiment.

When the laser light is incident on diffraction grating optical coupler 106 at predetermined angle 108 as in the first embodiment and the second embodiment, light guide member 105 receives the laser light in the direction of the horizontal component at angle 108. On the other hand, when the laser light is perpendicularly incident on diffraction grating optical coupler 106, the laser light is coupled to light guide member 105 in the incident direction and in the opposite direction.

When the light guide member is not formed in the opposite direction, the laser light is reflected at the end of diffraction grating optical coupler 106, and the reflected light and the laser light incident on light guide member 105 interfere with each other.

When the light guide member branches into two by using this phenomenon and the branched light guide member is used, the laser light of semiconductor laser 101 may be perpendicularly incident on diffraction grating optical coupler 106.

Figure 5:
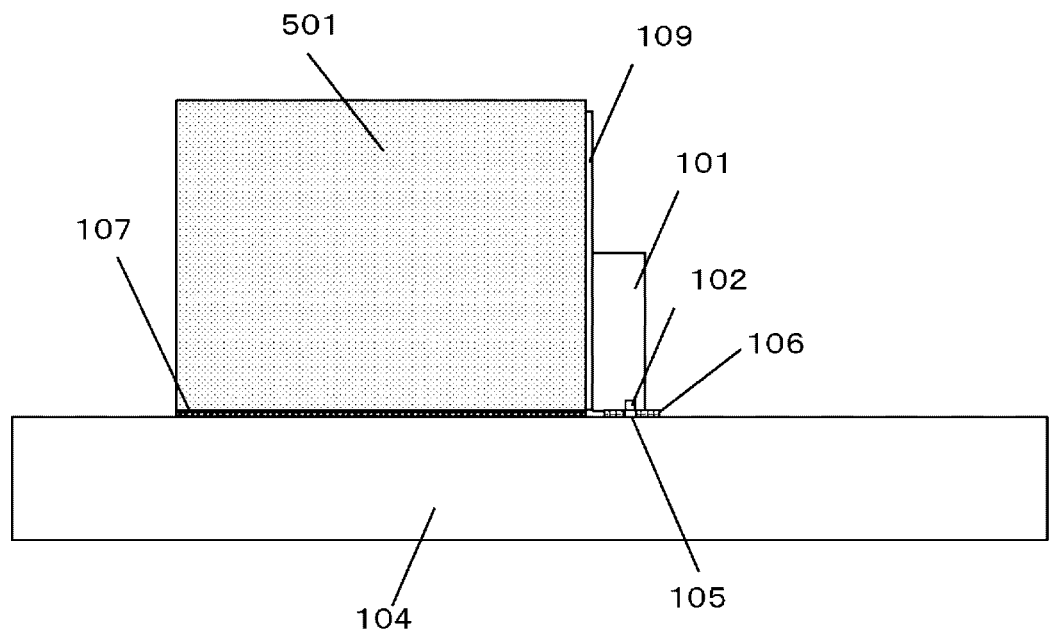
FIG. 5 is a sectional view showing a mounting structure according to a third embodiment.

The third embodiment will be described with reference to FIG. 5. FIG. 5 is a schematic sectional view showing a mounting structure according to the third embodiment. Electrode 109 for bonding semiconductor laser 101 is formed on the front surface of submount board 501. The side surface of submount board 501 is perpendicularly cut. Semiconductor laser 101 is mounted on submount board 501. Submount board 501 and main board 104 are bonded to each other via adhesive material 107. In order to shorten the distance between semiconductor laser 101 and diffraction grating optical coupler 106, it is preferable to mount semiconductor laser 101 on the end of submount board 501 on the surface side bonded to main board 104. In consideration of optical efficiency, the bonding angle between main board 104 and submount board 103 is preferably 90°±5°.

Figure 6:
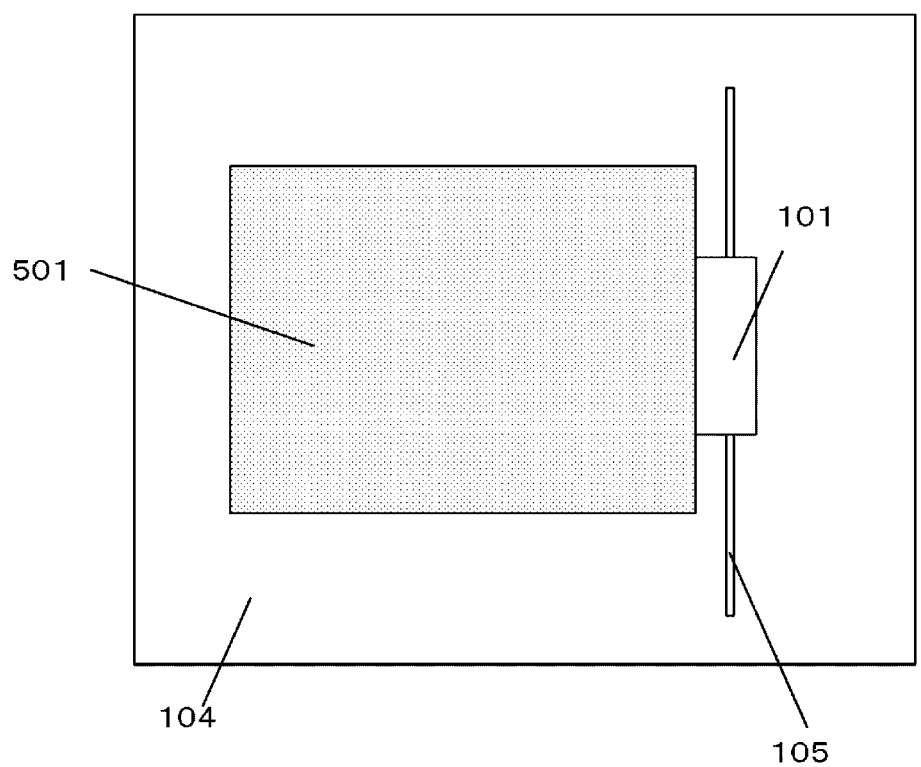
FIG. 6 is a plan view showing the mounting structure according to the third embodiment.

FIG. 6 is a plan view of the mounting structure showing a configuration in which light guide member 105 is branched when viewed from above. Light guide member 105 and diffraction grating optical coupler 106 are formed on main board 104. Light guide member 105 branches from diffraction grating optical coupler 106 in two directions.

Figure 7:
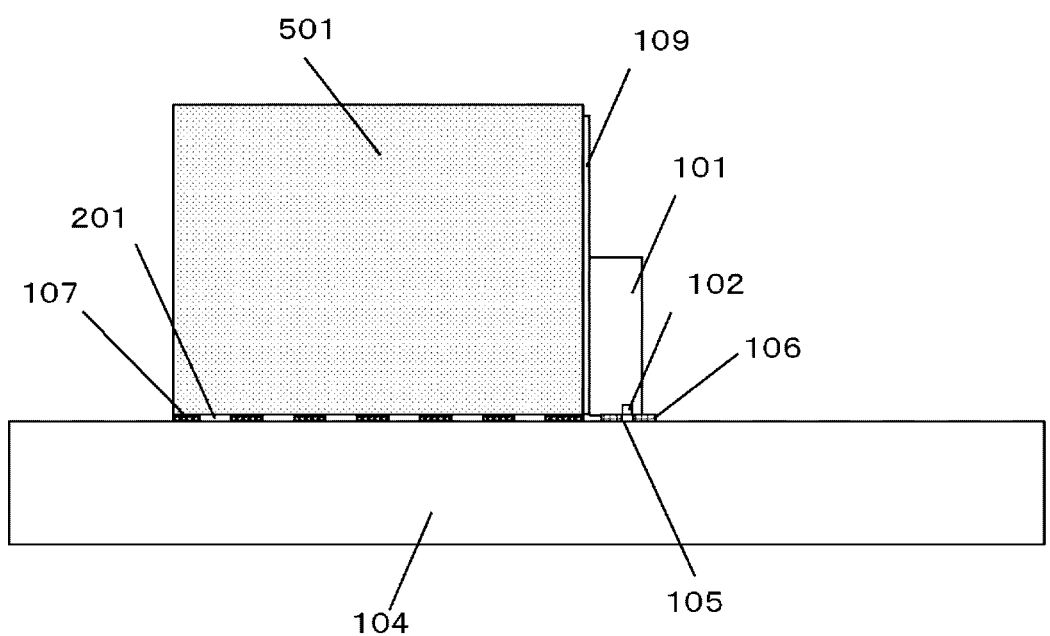
FIG. 7 is a sectional view showing the mounting structure according to the third embodiment.

A configuration for reducing the distance between semiconductor laser 101 and diffraction grating optical coupler 106 will be described with reference to FIG. 7. Semiconductor laser 101 is mounted on submount board 501 so that the surface bonded to main board 104 corresponds to the emission surface of semiconductor laser 101. The distance between semiconductor laser 101 and diffraction grating optical coupler 106 is adjusted by the height of spacer 201. The reason why the gap between submount board 501 and main board 104 can be adjusted with high accuracy by spacer 201 is the same as that described with reference to FIG. 2 in the embodiment described above.

The mounting structure for the optical module according to the present disclosure can be used to create an optical sensing device using silicon photonics or laser light in which miniaturization of the light guide member will proceed in the future.

What is claimed is:

1. A mounting structure for an optical module, the mounting structure comprising:
    a light emitting element;
    a submount board having a first surface on which the light emitting element is mounted;
    a main board on which the submount board is mounted;
    a light guide member provided on the main board; and
    a diffraction grating optical coupler provided on the main board and connected to the light guide member,
    wherein a second surface of the submount board is fixed to the main board, the second surface being different from the first surface on which the light emitting element is mounted,
    wherein an angle between a surface of the main board on which the diffraction grating optical coupler is mounted and the first surface of the submount board on which the light emitting element is mounted is 54.75°±5°, and
    wherein an angle between the second surface of the submount board fixed to the main board and the first surface of the submount board on which the light emitting element is mounted is 54.75°±5°.

2. The mounting structure for an optical module of claim 1, wherein the diffraction grating optical coupler is irradiated with light from the light emitting element.

3. The mounting structure for an optical module of claim 1, wherein the submount board is made of silicon.

4. The mounting structure for an optical module of claim 3, wherein the silicon is processed in a predetermined crystal orientation.

5. A mounting structure for an optical module of claim 1, further comprising a spacer at a bonding portion between the main board and the submount board.

6. The mounting structure for an optical module of claim 5, wherein a distance between the main board and the submount board is set to a predetermined value by the spacer.

7. The mounting structure for an optical module of claim 1, further comprising:
    a lens disposed between the light emitting element and the diffraction grating optical coupler.

8. The mounting structure for an optical module of claim 7, wherein the lens is configured to stop light of the light emitting element and to transmit the light to the diffraction grating optical coupler.

9. The mounting structure for an optical module of claim 1, further comprising:
    a high refractive member disposed between the light emitting element and the diffraction grating optical coupler and having a high refractive index with respect to light from the light emitting element; and
    a low refractive member having a lower refractive index than the high refractive member with respect to light from the light emitting element,
    wherein the light emitting element and the diffraction grating optical coupler are connected with light by the high refractive member and the low refractive member.

10. The mounting structure for an optical module of claim 9, wherein the high refractive member is located inside and the low refractive member is located outside the high refractive member.

* * * * *